(12) United States Patent
Cho et al.

(10) Patent No.: US 9,287,466 B2
(45) Date of Patent: Mar. 15, 2016

(54) LIGHT EMITTING DEVICE PACKAGE AND METHOD OF MANUFACTURING THE SAME

(71) Applicant: LG INNOTEK CO., LTD, Seoul (KR)

(72) Inventors: Bum Chul Cho, Jeonju-si (KR); Jin Soo Park, Gwangju (KR)

(73) Assignee: LG INNOTEK CO., LTD., Seoul (KR)

( * ) Notice: Subject to any disclaimer, the term of this patent is extended or adjusted under 35 U.S.C. 154(b) by 131 days.

(21) Appl. No.: 14/088,180

(22) Filed: Nov. 22, 2013

(65) Prior Publication Data

US 2014/0077249 A1    Mar. 20, 2014

Related U.S. Application Data

(63) Continuation of application No. 12/668,996, filed as application No. PCT/KR2008/004308 on Jul. 23, 2008, now Pat. No. 8,624,268.

(30) Foreign Application Priority Data

Jul. 25, 2007  (KR) .................. 10-2007-0074399

(51) Int. Cl.
| | |
|---|---|
| *H01L 33/48* | (2010.01) |
| *H01L 33/60* | (2010.01) |
| *H01L 33/44* | (2010.01) |
| *H01L 33/46* | (2010.01) |
| *H01L 33/62* | (2010.01) |

(52) U.S. Cl.
CPC .............. *H01L 33/483* (2013.01); *H01L 33/60* (2013.01); *H01L 33/44* (2013.01); *H01L 33/46* (2013.01); *H01L 33/486* (2013.01); *H01L 33/62* (2013.01); *H01L 2224/48091* (2013.01); *H01L 2224/49107* (2013.01); *H01L 2933/0091* (2013.01)

(58) Field of Classification Search
CPC ..... H01L 2924/00; H01L 27/12; H01L 33/20; H01L 33/10; H01L 33/44; H01L 33/22; H01L 33/38; H01L 33/54
USPC .................. 257/81, 95, 98, 99, 100, 117, 118
See application file for complete search history.

(56) References Cited

U.S. PATENT DOCUMENTS

| | | |
|---|---|---|
| 6,534,794 B1 | 3/2003 | Nakanishi et al. |
| 7,738,764 B2 | 6/2010 | Kim |
| 7,834,370 B2 | 11/2010 | Koya et al. |

(Continued)

FOREIGN PATENT DOCUMENTS

| | | |
|---|---|---|
| CN | 1702507 A | 11/2005 |
| EP | 1615268 A2 | 1/2006 |

(Continued)

OTHER PUBLICATIONS

Cancellation Request from corresponding German Utility Model No. DE 202008018180 and partial English Translation thereof.

(Continued)

*Primary Examiner* — Cathy N Lam
(74) *Attorney, Agent, or Firm* — Birch, Stewart, Kolasch & Birch, LLP

(57) ABSTRACT

A light emitting device package is provided. The light emitting device package comprises a substrate comprising a plurality of protrusions, an insulating layer on the substrate, a metal layer on the insulating layer, and a light emitting device on the substrate electrically connected to the metal layer.

20 Claims, 4 Drawing Sheets

(56) References Cited

U.S. PATENT DOCUMENTS

| | | |
|---|---|---|
| 2005/0264716 A1 | 12/2005 | Kim et al. |
| 2006/0049423 A1 | 3/2006 | Yamaguchi et al. |
| 2006/0170335 A1 | 8/2006 | Cho et al. |
| 2007/0114555 A1 | 5/2007 | Takemoto et al. |
| 2007/0200131 A1* | 8/2007 | Kim .................. 257/99 |
| 2007/0262336 A1* | 11/2007 | Tamaki et al. ........... 257/98 |
| 2009/0032800 A1* | 2/2009 | Lee et al. ............. 257/13 |
| 2009/0122554 A1 | 5/2009 | Ohashi et al. |
| 2011/0032435 A1 | 2/2011 | Kimura |

FOREIGN PATENT DOCUMENTS

| | | |
|---|---|---|
| EP | 1686630 A2 | 8/2006 |
| EP | 1816686 A1 | 8/2007 |
| JP | 59-166535 A | 9/1984 |
| JP | 11-26811 | 1/1999 |
| JP | 2001-111165 A | 4/2001 |
| JP | 2001-196644 A | 7/2001 |
| JP | 2004-356213 A | 12/2004 |
| JP | 2005-57073 A | 3/2005 |
| JP | 2005-136378 A | 5/2005 |
| JP | 2005-285899 A | 10/2005 |
| JP | 2005-311153 A | 11/2005 |
| JP | 2006-093626 A | 4/2006 |
| JP | 2006-156506 A | 6/2006 |
| JP | 2003-249689 A | 9/2006 |
| JP | 2006-253288 A | 9/2006 |
| JP | 2006-303191 A | 11/2006 |
| JP | 2006-303359 A | 11/2006 |
| JP | 2006-324438 A | 11/2006 |
| JP | 2007-157804 A | 6/2007 |
| JP | 2007-157805 A | 6/2007 |
| JP | 2007-235137 A | 9/2007 |
| KR | 10-2003-0055625 A | 2/2005 |
| KR | 10-2005-0017979 A | 2/2005 |
| KR | 10-2006-0022374 A | 2/2005 |
| KR | 10-2006-0000464 B1 | 1/2006 |
| KR | 10-2006-0004569 A | 1/2006 |
| WO | WO 2006/057172 A1 | 6/2006 |
| WO | WO 2007/049938 A1 | 5/2007 |

OTHER PUBLICATIONS

English Machine Translation of JP 2006-093626.
English machine translation of JP-2005-57073-A dated Mar. 3, 2005.
English machine translation of JP-2007-157804-A dated Jun. 21, 2007.
English machine translation of JP-2007-157805-A dated Jun. 21, 2007.
Machine Translation of JP 2006-253288 A.
Machine Translation of JP-2006-324438 A.
Machine Translation of KR 10-2005-0017979.
Machine translation of KR 10-2006-0004569.
Machine translation of KR 10-2006-0022374.
Translation of KR 10-2006-0000464.

* cited by examiner

LIGHT EMITTING DEVICE PACKAGE AND METHOD OF MANUFACTURING THE SAME

This application is a Continuation of co-pending application Ser. No. 12/668,996 filed on Jan. 13, 2010, which is the national stage of PCT International Application No. PCT/KR2008/004308 filed on Jul. 23, 2008, which claims priority to Application No. 10-2007-0074399 filed in the Republic of Korea on Jul. 25, 2007. The entire contents of all the above applications are hereby incorporated by reference.

BACKROUND

Field of the Disclosure

The present disclosure relates to a light emitting device package and a method of manufacturing the same.

SUMMARY OF THE INVENTION

A light emitting diode (LED) has been widely used as a light emitting device. The LED includes an n-type semiconductor layer, an active layer, and a p-type semiconductor layer that are stacked on each other so that light is generated and emitted from the active layer in accordance with a voltage applied thereto.

The light emitting device package includes the LED, a substrate supporting the LED, and a conductive member supplying electric power to the LED.

In recent years, an effort to increase light efficiency by improving a structure of the light emitting device has been continued. Meanwhile, an effort to increase the light efficiency by improving a structure of the light emitting device package including the light emitting device has been also continued.

BRIEF SUMMARY

Embodiments provide a light emitting device package that is improved in light emitting efficiency and a method of manufacturing the same.

Embodiments also provide a light emitting device package that can effectively scatter light emitting from a light emitting device and a method of manufacturing the light emitting device package.

In an embodiment, a light emitting device package comprises a substrate comprising a plurality of protrusions; an insulating layer on the substrate; a metal layer on the insulating layer; and a light emitting device on the substrate electrically connected to the metal layer.

In an embodiment, a light emitting device package comprises: a substrate comprising a groove and a plurality of protrusions formed on at least one of bottom and side surfaces of the groove; an insulating layer on the substrate; a metal layer on the insulating layer; and a light emitting device that is provided in the groove and electrically connected to the metal layer.

In an embodiment, a method of manufacturing a light emitting device package comprises etching a substrate to form a groove; partly etching the groove to form a plurality of protrusions; forming an insulating layer on the substrate; forming a metal layer on the insulating layer; and installing a light emitting device on a bottom surface of the groove and electrically connecting the light emitting device to the metal layer.

The details of one or more embodiments are set forth in the accompanying drawings and the description below. Other features will be apparent from the description and drawings, and from the claims.

The embodiments can provide a light emitting device package that is improved in light emitting efficiency and a method of manufacturing the light emitting device package.

The embodiments also can provide a light emitting device package that can effectively scatter light emitted from the light emitting device and a method of manufacturing the light emitting device package.

DETAILED DESCRIPTION OF THE EMBODIMENTS

Reference will now be made in detail to the embodiments of the present disclosure, examples of which are illustrated in the accompanying drawings.

Figure 1:
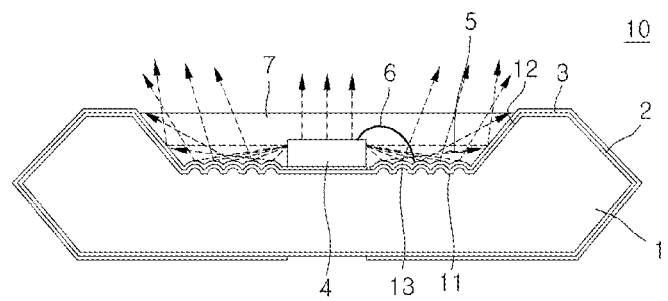
FIG. 1 is a cross-sectional view of a light emitting device package according to a first embodiment.
Figure 2:
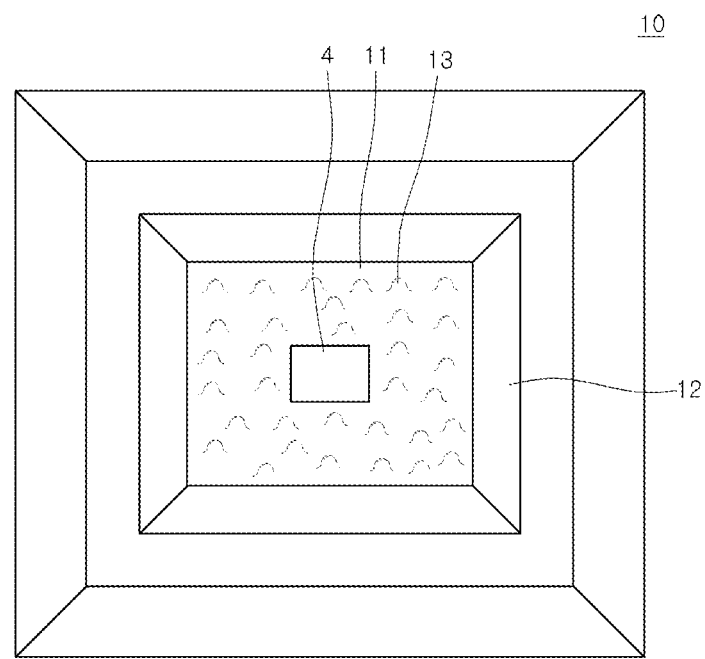
FIG. 2 is a top plan view of the light emitting device package of FIG. 1.

FIG. 1 is a cross-sectional view of a light emitting device package according to a first embodiment, and FIG. 2 is a top plan view of the light emitting device package of FIG. 1.

Referring to FIGS. 1 and 2, a light emitting device package 10 includes a substrate 1, an insulating layer 2 formed on a surface of the substrate 1, a metal layer 3 formed on a surface of the insulating layer 2, and a light emitting device 4 electrically connected to the metal layer 3 and installed on the substrate 1.

The substrate 1 may be a wafer formed of silicon. A groove 5 is formed on a surface of the substrate 1.

By the groove 5 formed on the substrate 1, a bottom surface 11 and an inclined surface 12 are defined on the substrate 1. A plurality of protrusions 13 are formed on the bottom surface 11. For example, each of the protrusions 13 is formed in one of a hemispherical shape, a circular cone shape, a circular column shape, a polygonal shape, and a polygonal cone shape.

The insulating layer 2 may be a silicon oxide layer that is formed by oxidizing the substrate 1. The insulating layer 2 may be formed on top, side, and under surfaces of the substrate 1.

Since the plurality of protrusions 13 are formed on the bottom surface 11 of the groove 5, the insulating layer 2 formed in the groove 5 is formed to correspond to the protrusions 13.

The metal layer 3 is divided into two sections that are electrically separated from each other and is electrically connected to the light emitting device 4. The metal layer 3 is formed on the top surface of the substrate 1. The metal layer 3 may be further formed on the side and bottom surfaces.

Since the plurality of protrusions 13 are formed on the bottom surface 11 of the groove 5, the metal layer 3 formed in the groove 5 is formed to correspond to the protrusions 13.

The light emitting device 4 is formed in the groove 5.

The light emitting device 4 is electrically connected to the metal layer 3 to be applied with external electric power from the metal layer 3. The light emitting device 4 has a first electrode layer that is electrically connected to the metal layer 3 by directly contacting the metal layer 3 and a second electrode layer that is connected to the metal layer 3 by a wire 6.

In the embodiment, the metal layer 3 functions to not only apply the electric power to the light emitting device 4 but also increase the light efficiency by reflecting the light emitted from the light emitting device 4. Particularly, the metal layer 3 formed on the inclined surface 12 reflects the light upward to increase the light efficiency.

The metal layer 3 may be formed of aluminum (Al) or silver (Ag) that has a relatively excellent reflectance. Alternatively, the metal layer 3 may be formed by coating the Al or Ag on a conductive metal such as copper (Cu).

In addition, since the surface of the metal layer 3 formed in the groove 5 is uneven by the protrusions 13 formed on the bottom surface 11 of the groove 5, the light emitted from the light emitting device 4 may be scattered.

Meanwhile, the groove 5 may be filled with a molding member 7 for protecting the light emitting device 4 and the wire 6. A top surface of the molding member 7 may be formed in a concave shape, a convex shape, a planar shape, or the like. A view angle of the light emitted from the light emitting device 4 may be altered in accordance with the shape of the molding member 7.

In addition, the molding member 7 may include phosphors. The phosphors can change a color of the light emitted from the light emitting device 4.

In the embodiment, the light emitting device package 10 scatters the light emitted from the light emitting device 4 to increase the light efficiency.

FIGS. 3 to 7 are diagrams illustrating a method of manufacturing the light emitting device package of FIGS. 1 and 2.

Figure 3:
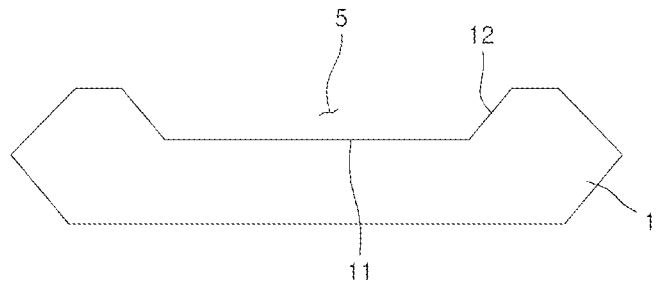
FIGS. 3 to 7 are diagrams illustrating a method of manufacturing the light emitting device package of FIG. 1.

Referring to FIG. 3, the substrate 1 is prepared and the groove 5 is formed by etching the surface of the substrate 1. The bottom surface 11 and the inclined surface 12 are formed on the substrate 1 by the groove 5.

A wafer formed of silicon may be used as the substrate 1. The groove 5 may be formed by wet-etching the top surface of the substrate 1. A potassium hydroxide (KOH) solution or a HNA ($HF+HNO_3+CH_3COOH$) may be used for the wet-etching.

Figure 4:
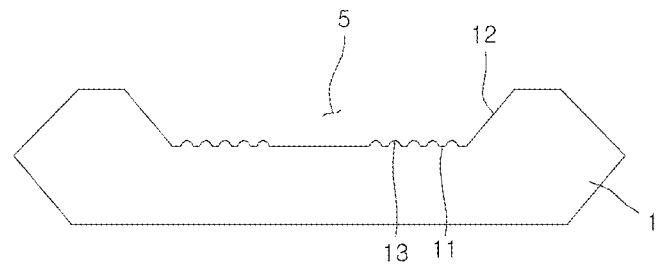

Referring to FIG. 4, the bottom surface 11 formed by the groove 5 is partly etched to form the protrusions 13.

For example, the protrusions 13 may be formed through a dry-etching using a photoresist pattern as a mask.

Figure 5:
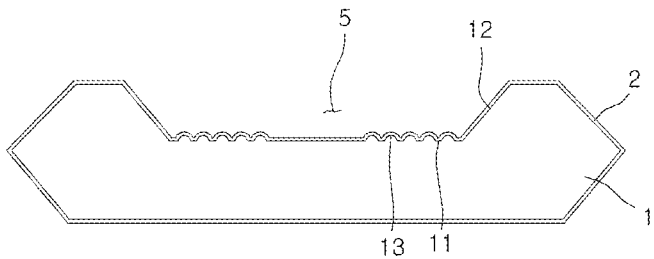

Referring to FIG. 5, the insulating layer 2 is formed on the surface of the substrate 1 on which the protrusions 13 are formed. The insulating layer 2 functions to suppress the generation of the leakage current on the substrate 1. The insulating layer may be a silicon oxide layer formed by oxidizing the substrate 1.

Figure 6:
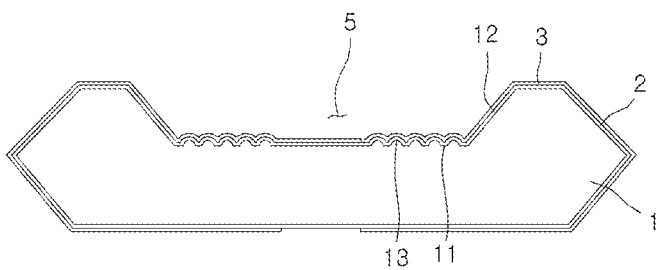

Referring to FIG. 6, the metal layer 3 is formed on the surface of the insulating layer 2 formed on the substrate 1.

The metal layer 3 may be formed through an E-beaming process, a sputtering process, or an electro-plating deposition process. The metal layer 3 is divided into two sections that are electrically separated from each other.

Figure 7:
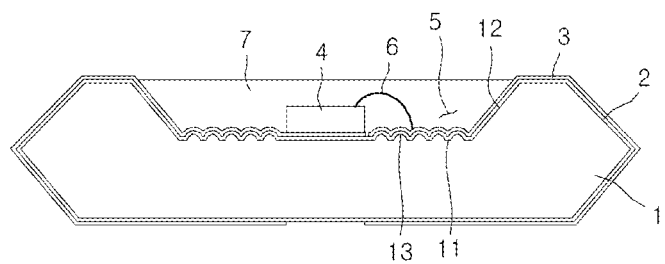

Referring to FIG. 7, the light emitting device 4 is installed in the groove 5 of the substrate 1. The first electrode layer of the light emitting device 4 is electrically connected to the metal layer 3 by directly contacting the metal layer 3. The second electrode layer may be electrically connected to the metal layer 3 by a wire 6.

In addition, the molding member 7 including the phosphors is filled in the groove 5 of the substrate 1.

Figure 8:
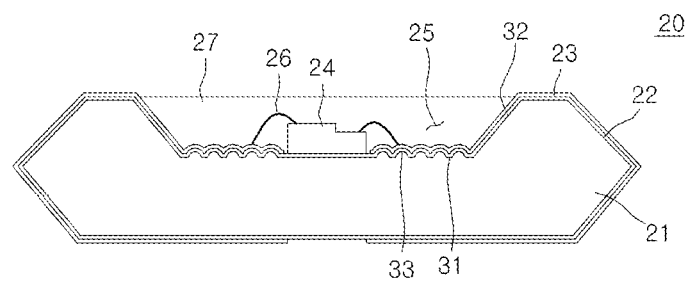
FIG. 8 is a cross-sectional view of a light emitting device according to a second embodiment.

FIG. 8 is a cross-sectional view of a light emitting device according to a second embodiment.

Referring to FIG. 8, a light emitting device package 20 includes a substrate 21, an insulating layer 22 formed on a surface of the substrate 21, a metal layer 23 formed on a surface of the insulating layer 22, a light emitting device 24 installed on a top surface of the substrate 21, and a wire 26 electrically connecting the light emitting device 24 to the metal layer 23.

The substrate 21 may be formed of silicon. A groove 25 is formed on the top surface of the substrate 21.

By the groove 25 formed on the substrate 21, a bottom surface 31 and an inclined surface 32 are defined on the top surface of the substrate 21. A plurality of protrusions 33 are formed on the bottom surface 31.

The insulating layer 22 may be a silicon oxide layer that is formed by oxidizing the substrate 21. The insulating layer 22 may be formed on top, side, and under surfaces of the substrate 21.

Since the plurality of protrusions 33 are formed on the bottom surface 31 of the groove 25, the insulating layer 22 formed in the groove 22 is formed to correspond to the protrusions 33.

The metal layer 23 is divided into two sections that are electrically separated from each other and is electrically connected to the light emitting device 24. The metal layer 23 is formed on the top surface of the insulating layer 22. The metal layer 23 may be further formed on the side and bottom surfaces of the insulating layer 22.

Since the plurality of protrusions 33 are formed on the bottom surface 31 of the groove 25, the metal layer 23 formed in the groove 25 is formed to correspond to the protrusions 33.

The light emitting device 24 is formed in the groove 25.

The light emitting device 24 is electrically connected to the metal layer 23 by the wire 26 to be applied with external electric power from the metal layer 23.

In the embodiment, the metal layer 23 functions to not only apply the electric power to the light emitting device 24 but also increase the light efficiency by reflecting the light emitted from the light emitting device 24.

In addition, since the surface of the metal layer 23 formed in the groove is uneven by the protrusions 33 formed on the bottom surface 31 of the groove 5, the light emitted from the light emitting device 24 may be scattered.

Meanwhile, the groove 5 may be filled with a molding member 27 including phosphors.

In the embodiment, the light emitting device package 20 can effectively scatter the light emitted from the light emitting device 24 using the protrusions 33, thereby improving the light efficiency.

Figure 9:
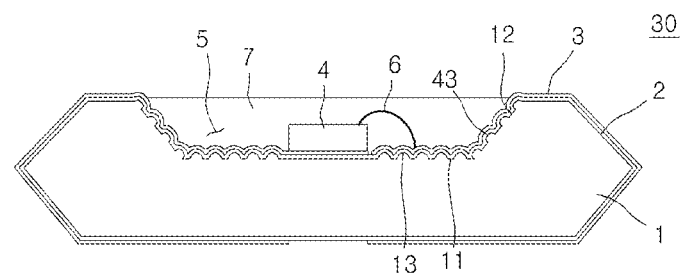
FIG. 9 is a cross-sectional view of a light emitting device according to a third embodiment.
Figure 10:
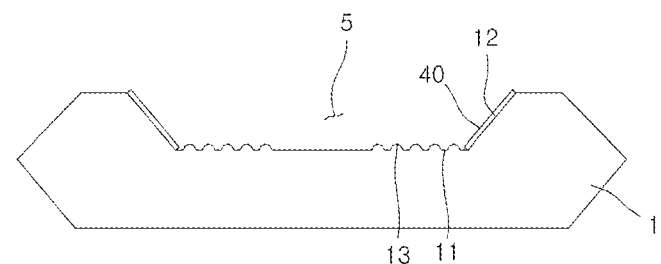
FIGS. 10 to 12 are diagrams illustrating a method of manufacturing the light emitting device package of FIG. 9.
Figure 11:
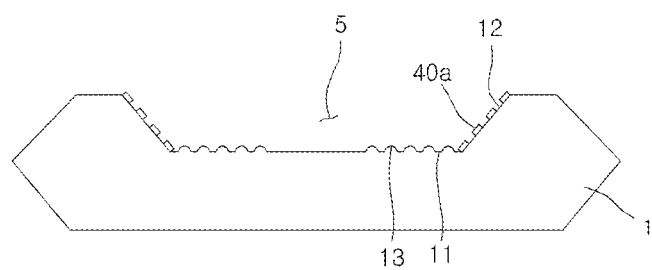
Figure 12:
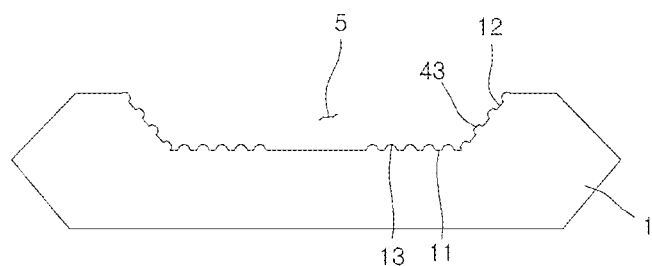

FIG. 9 is a cross-sectional view of a light emitting device according to a third embodiment, and FIGS. 10 to 12 are diagrams illustrating a method of manufacturing the light emitting device package of FIG. 9. In the description of this third embodiment, differences from the first embodiment will be mainly described.

Referring to FIG. 9, a light emitting device package 30 includes a substrate 1, an insulating layer 2 formed on a surface of the substrate 1, a metal layer 3 formed on a surface of the insulating layer 2, and a light emitting device 4 electrically connected to the metal layer 3 and installed on the substrate 1.

The substrate 1 may be a wafer formed of silicon. A groove 5 is formed on a top surface of the substrate 1.

By the groove 5 formed on the substrate 1, a bottom surface 11 and an inclined surface 12 are defined on the substrate 1, A plurality of protrusions 13 are formed on the bottom surface 11, A plurality of protrusions 43 are formed on the inclined surface 12. For example, each of the protrusions 13 is formed in at least one of a hemispherical shape, a circular cone shape, a circular column shape, a polygonal shape, and a polygonal cone shape.

The light emitting device 4 is electrically connected to the metal layer 3 to be applied with external electric power from the metal layer 3. The light emitting device 4 has a first electrode layer that is electrically connected to the metal layer 3 by directly contacting the metal layer 3 and a second electrode layer that is electrically connected to the metal layer 3 by a wire 6.

In the embodiment, the metal layer 3 functions to not only apply the electric power to the light emitting device 4 but also increase the light efficiency by reflecting the light emitted from the light emitting device 4. Particularly, the metal layer 3 formed on the inclined surface 12 reflects the light upward to increase the light efficiency.

In addition, since the surface of the metal layer 3 formed in the groove is uneven by the protrusions 13 formed on the bottom surface 11 of the groove 5, the light emitted from the light emitting device 4 may be scattered.

Meanwhile, the groove 5 may be filled with a molding member 7 for protecting the light emitting device 4 and the wire 6. The molding member 7 may include phosphors.

In the embodiment, the light emitting device package 30 scatters the light emitted from the light emitting device 4 to increase the light efficiency.

FIGS. 10 to 12 are diagrams illustrating a method of manufacturing the light emitting device package of FIG. 9. In FIGS. 10 to 12, only a process for forming the protrusions 43 on the inclined surface 12 will be described. Other processes are same as those of the first embodiment.

Referring to FIG. 10, the substrate 1 is first prepared and the groove 5 is formed by etching the top surface of the substrate 1. The bottom surface 11 and the inclined surface 12 are formed on the top surface of the substrate 1 by the groove 5.

A wafer formed of silicon may be used as the substrate 1. The groove 5 may be formed by wet-etching the top surface of the substrate 1. A potassium hydroxide (KOH) solution or a HNA (HF+HNO$_3$+CH$_3$COOH) may be used for the wet-etching.

In addition, the bottom surface 11 formed by the groove 5 is partly etched to form the protrusions 13. For example, the protrusions 13 may be formed through a dry-etching using a photoresist pattern as a mask.

Next, a silver thin film 40 is deposited on the inclined surface 12 to have a thickness of 100 Å or less.

Referring to FIG. 11, the silver thin film 40 is heat-treated to form a silver thin film pattern 40a that are partly formed on the inclined surface 12.

Referring to FIG. 12, the inclined surface 12 is etched by using the silver thin film pattern 40a as a mask to form the protrusions 43 on the inclined surface 12.

Therefore, the protrusions 13 and 43 are respectively formed on the bottom and inclined surfaces 11 and 13 of the groove 5.

Although not shown in FIGS. 10 to 12, the protrusions 13 on the botton surface 11 also can be formed by using the silver thin pattern 40a, not using a photoresist pattern as a mask.

The subsequent processes are same as those of the first embodiment.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The light emitting device packages of the embodiments can be used as lightings or light sources of a variety of electronic devices.

What is claimed is:

1. A light emitting device package, comprising:
    a substrate with a recess, the substrate including a border portion disposed around the recess, and a base portion including a top surface forming a bottom of the recess, a bottom surface opposing the top surface of the base portion, and a side surface disposed between the top surface of the base portion and the bottom surface of the base portion, the top surface of the base portion being planar;
    a metal layer on the top surface of the base portion including protrusions such that a top surface of the metal layer has roughness, the metal layer extended to the bottom surface of the base portion; and
    a light emitting device on the metal layer on the top surface of the base portion,
    wherein an end of the metal layer on the bottom surface of the base portion is disposed between the light emitting device and a top surface of the border portion of the substrate so as not to be disposed under the light emitting device.

2. The light emitting device package according to claim 1, wherein the border portion of the substrate includes an inner side surface toward the recess and an outer side surface, and
    wherein the end of the metal layer on the bottom surface of the base portion is disposed between the light emitting device and the inner side surface of the border portion of the substrate.

3. The light emitting device package according to claim 2, wherein the metal layer on the top surface of the base portion is extended to the bottom surface of the base portion via the side surface of the base portion, and
    wherein the metal layer on the side surface of the base portion is exposed outside.

4. The light emitting device package according to claim 2, wherein an entire portion of the metal layer located on the top surface of the base portion includes the protrusions.

5. The light emitting device package according to claim 2, wherein both the inner side surface of the border portion and the outer side surface of the border portion is inclined with reference to the top surface of the base portion.

6. The light emitting device package according to claim 5, wherein the metal layer on the top surface of the base portion is extended to the bottom surface of the base portion via the inner side surface of the border portion, the top surface of the border portion, and the outer side surface of the border portion, and wherein the metal layer on the inner side surface of the border portion includes protrusions.

7. The light emitting device package according to claim 2, wherein a portion of the bottom surface of the base portion which the light emitting device is disposed under is exposed outside.

8. The light emitting device package according to claim 2, wherein the light emitting device is positioned at a center of the base portion.

9. The light emitting device package according to claim 2, further comprising a conductive metal layer disposed between the metal layer and the substrate.

10. The light emitting device package according to claim 9, wherein the metal layer comprises aluminum or silver.

11. The light emitting device package according to claim 9, wherein the conductive metal layer comprises copper.

12. The light emitting device package according to claim 2, further comprising a molding member filled in the recess.

13. The light emitting device package according to claim 12, wherein the molding member includes phosphors, and wherein the molding member has a top surface having a concave shape.

14. The light emitting device package according to claim 1, further comprising an insulating layer disposed between the substrate and the metal layer.

15. The light emitting device package according to claim 14, wherein the substrate comprises silicon, and wherein the insulating layer comprises silicon oxide.

16. The light emitting device package according to claim 14, wherein the insulating layer includes protrusions such that a top surface of the insulating layer has roughness.

17. The light emitting device package according to claim 15, wherein the protrusions of the insulating layer corresponds to the protrusions of the metal layer.

18. A lighting device, comprising:

a light emitting device package comprising a substrate with a recess, the substrate including a border portion disposed around the recess, and a base portion including a top surface forming a bottom of the recess, a bottom surface opposing the top surface of the base portion, and a side surface disposed between the top surface of the base portion and the bottom surface of the base portion, the top surface of the base portion being planar;

a metal layer on the top surface of the base portion including protrusions such that a top surface of the metal layer has roughness, the metal layer extended to the bottom surface of the base portion; and a light emitting device on the metal layer on the top surface of the base portion, wherein an end of the metal layer on the bottom surface of the base portion is disposed between the light emitting device and a top surface of the border portion of the substrate so as not to be disposed under the light emitting device, wherein the border portion of the substrate includes an inner side surface toward the recess and an outer side surface, and wherein the end of the metal layer on the bottom surface of the base portion is disposed between the light emitting device and the inner side surface of the border portion of the substrate.

19. The lighting device according to claim 18, further comprising a molding member filled in the recess, wherein the molding member includes phosphors, and wherein the molding member has a top surface in a concave shape.

20. The lighting device according to claim 19, wherein the metal layer on the top surface of the base portion is extended to the bottom surface of the base portion via the side surface of the base portion, wherein the metal layer on the side surface of the base portion is exposed outside, and wherein an entire portion of the metal layer located on the top surface of the base portion includes the protrusions.

* * * * *